United States Patent
Alavi et al.

(10) Patent No.: US 6,392,271 B1
(45) Date of Patent: *May 21, 2002

(54) STRUCTURE AND PROCESS FLOW FOR FABRICATION OF DUAL GATE FLOATING BODY INTEGRATED MOS TRANSISTORS

(75) Inventors: Mohsen Alavi, Beaverton; Ebrahim Andideh; Scott Thompson, both of Portland; Mark T. Bohr, Aloha, all of OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/342,022

(22) Filed: Jun. 28, 1999

(51) Int. Cl.$^7$ ............................................. H01L 29/76
(52) U.S. Cl. ................ 257/328; 257/331; 257/365; 257/329; 257/302; 438/176; 438/173; 438/178
(58) Field of Search ............................. 257/328, 338, 257/329, 330, 331, 365; 29/571; 438/399, 176, 173, 178

(56) References Cited

U.S. PATENT DOCUMENTS

| 4,495,693 A | | 1/1985 | Iwahashi et al. | |
|---|---|---|---|---|
| 4,517,731 A | * | 5/1985 | Khan | ........................... 29/571 |
| 5,172,200 A | | 12/1992 | Muragishi et al. | |
| 5,243,234 A | | 9/1993 | Lin et al. | |
| 5,266,507 A | | 11/1993 | Wu | |
| 5,298,463 A | * | 3/1994 | Sandhu et al. | ............... 437/192 |
| 5,482,871 A | | 1/1996 | Pollack | |
| 5,723,893 A | | 3/1998 | Yu et al. | |
| 5,757,038 A | | 5/1998 | Tiwari et al. | |
| 6,034,389 A | * | 3/2000 | Burns, Jr. et al. | ............ 257/301 |
| 6,107,660 A | * | 8/2000 | Yang et al. | .................. 257/329 |
| 6,114,725 A | * | 9/2000 | Furukawa et al. | ........... 257/330 |
| 6,320,222 B1 | * | 11/2001 | Forbes et al. | ................ 257/331 |

OTHER PUBLICATIONS

A Deep Submicron Si1–xGex/Si Vertical PMOSFET Fabricated by Ge Ion Implantation. K.C. Liu et al.; IEEE Electron Device Letters, vol. 19, No. 1; Jan. 1998.
Self–Aligned (Top and Bottom Double–Gate MOSFET with a 25 nm Thick Silicon Channel. Hon–Sum Phillip Wong et al. IEEE. 1997.

* cited by examiner

*Primary Examiner*—Caridad Everhart
*Assistant Examiner*—Belur V Keshavan
(74) *Attorney, Agent, or Firm*—Blakely, Sokoloff, Taylor & Zafman LLP

(57) ABSTRACT

A dual gate transistor device and method for fabricating the same. First, a doped substrate is prepared with a patterned oxide layer on the doped substrate defining a channel. Next, a silicon layer is deposited to form the channel, with a gate oxide layer then grown adjacent the channel. Subsequently, a plurality of gate electrodes are formed next to the gate oxide layer and a drain is formed on the channel. After the drain is formed, an ILD layer sited. This ILD layer is etched to form a source region contact, a drain region contact, a first gate electrode contact, and a second gate electrode contact.

7 Claims, 12 Drawing Sheets

STRUCTURE AND PROCESS FLOW FOR FABRICATION OF DUAL GATE FLOATING BODY INTEGRATED MOS TRANSISTORS

BACKGROUND OF THE INVENTION

1. Field of the Invention

The present invention relates to the fabrication of integrated circuit devices on a semiconductor substrate. More particularly, the present invention relates to the fabrication of dual gate floating body MOS transistors.

2. Description of Related Art

As the semiconductor industry moves to smaller device feature sizes for ultra large scale integration (ULSI), transistor performance is expected in general to improve. However, the increased short channel effects due to the smaller feature sizes tends to limit the improved transistor performance. For example, in the past, field effect transistors (FETs) had gate electrodes and interconnecting lines made of polysilicon with widths that were greater than a micrometer ($\mu$m). Now the widths are much less than 0.15 $\mu$m, which leads to increased short channel effects. The increase in short channel effects results in higher transistor off state leakage, reduced current drive, and increased transistor variation, all of which are detrimental in current day ULSI applications.

Silicon-on-insulator (SOI) technology, an important integrated circuit technology, deals with forming transistors in a layer of semiconductor material that overlies an insulating layer. A common embodiment of SOI structures has a single crystal layer of silicon that overlies a layer of silicon dioxide. High performance and high density integrated circuits are achievable using SOI technology, because of the reduced parasitic elements that are present in the integrated circuits that use SOI transistors. Problems exist with SOI transistor technology, however, relating to the floating body in partially depleted SOI technology.

ULSI MOSFET devices are being continuously scaled down in channel length due to the increasing need for higher packing density and higher device speed. However, the continuous scaling down of geometry requires new transistor structures. Some innovative device structures and processes have been proposed that achieve the high performance of these small geometry devices, and yet can be made without requiring complicated fabrication techniques. One such device structure is a vertical MOSFET structure that provides a dual gate device which solves the floating body problem of partially depleted SOI transistors. A second important advantage of vertical MOS transistor technology is that the channel length scaling is not limited by the minimum lithographic resolution. The transistor channel length is instead determined by shallow trench etching and epitaxial layer growth techniques.

Transistors having two gate electrodes are known in the art, wherein there is a top gate and a bottom gate that may or may not be inherently self-aligned to the source/drain. N-channel double-gate MOSFET's with a 25 mm thick silicon channel have been successfully demonstrated. However, the process flow used to fabricate the two gate electrodes is complex and often uses non self-aligned source and drains. Further, although fully depleted floating body MOS devices have been proposed using planar transistors and SOI technology, they do not offer voltage control on the second gate, they require advanced SOI, advanced start material (thin body, thin box), and shallow trench isolation (STI). Thus, an improved structure and process flow allowing for fabrication of dual gate floating body NMOS and PMOS transistors is desired.

SUMMARY OF THE INVENTION

A dual gate transistor device and method for fabricating the same is described. First, a doped substrate is prepared with a patterned oxide layer on the doped substrate defining a channel. Next, a silicon layer is deposited to form the channel, with a gate oxide layer then grown adjacent the channel. Subsequently, a first and a second gate electrode are formed next to the gate oxide layer, and a drain region is formed on the channel. After the drain is formed, an interlayer dielectric (ILD) layer is deposited. This ILD layer is etched to form a source region contact, a drain region contact, a first gate electrode contact, and a second gate electrode contact.

BRIEF DESCRIPTION OF THE DRAWING

The invention is further described by way of example with reference to the accompanying drawings, wherein.

DETAILED DESCRIPTION

An improved method for fabricating dual gate floating body NMOS and PMOS transistors is disclosed. In the following description, numerous specific details are set forth such as specific materials, process parameters, dimensions, etc. in order to provide a thorough understanding of the present invention. It will be obvious, however, to one skilled in the art that these specific details need not be employed to practice the present invention. In other instances, well-known materials or methods have not been described in detail in order to avoid unnecessarily obscuring the present invention.

The present invention relates to dual gate floating body NMOS and PMOS transistors fabricated by a process offering several advantages over the prior art. The process disclosed herein requires only two to three additional masking steps when compared with conventional bulk MOS processing. The process flow described does not require silicon-on-insulator (SOI) technology or epi wafers as start material, offers full control over the second transistor gate based on planar interconnects, does not need STI isolation, and offers potential for successive vertical integration of multiple levels of transistors.

The present invention discloses an apparatus and method for the fabrication of the dual gate floating body NMOS and PMOS transistors described herein, however, the process flow will be discussed using the PMOS device as an example. Note that the NMOS device is fabricated in a parallel procedure, with the opposite dopants resulting in NMOS transistors. FIGS. 1–24 illustrate the process steps of a first embodiment of fabricating a dual gate floating body transistor.

Figure 1:
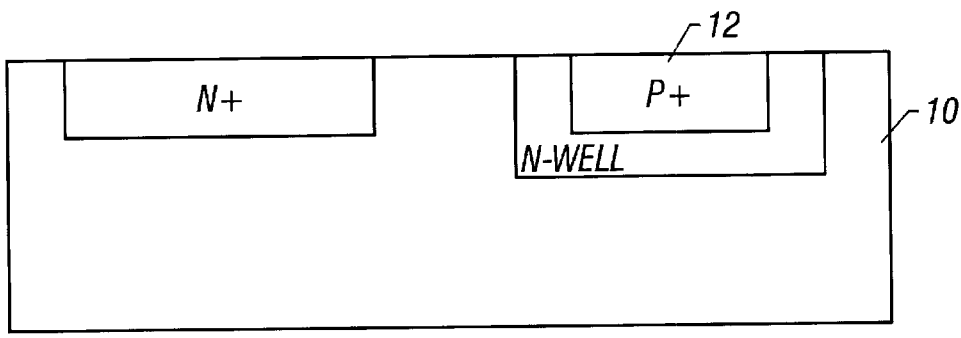
FIG. 1 is a cross-sectional view of a starting substrate for the manufacturing process for the device of the present invention.
Figure 2:
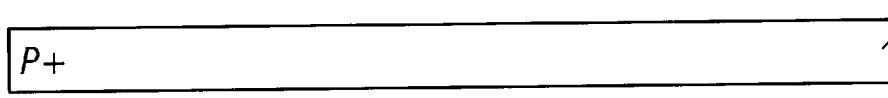
FIG. 2 is a cross-sectional view of the P+ region of FIG. 1 that forms the basis of the fabrication process of the PMOS device to be described.

FIG. 1 is a cross-sectional view of a starting substrate 10 for the process described herein. An SOI or epi wafer is not required for the starting substrate. Similarly, LOCOS or STI isolation is not needed, but n-well, N+, and P+ masks are needed here. The process flow described below will use merely the PMOS device 12 as an example and to simplify the following explanation. (Note, however, that the NMOS device may be fabricated with the opposite dopants in parallel along side the PMOS device.) Thus, FIG. 2 is a side view of the P+ layer 12 that forms the basis of the fabrication process described below.

Figure 3:
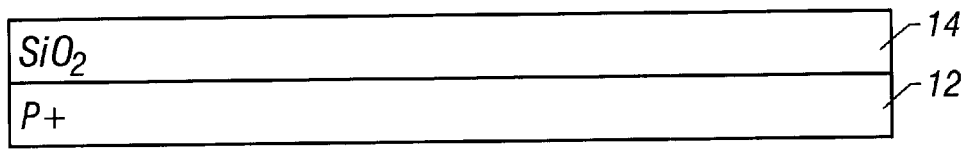
FIG. 3 is a cross-sectional view of the P+ layer of FIG. 2 with a layer of oxide deposited thereon.
Figure 4:
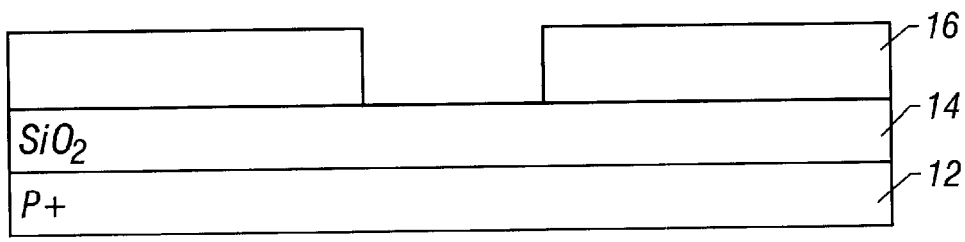
FIG. 4 is a cross-sectional view of the layers illustrated in FIG. 3 with a mask deposited and patterned thereon.
Figure 5:
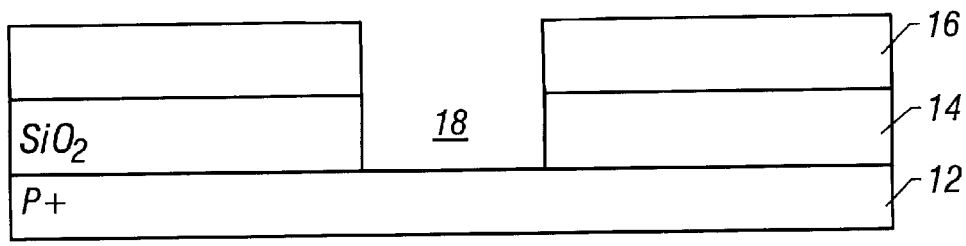
FIG. 5 is a cross-sectional view of the trench formed in the exposed portion illustrated in FIG. 4.
Figure 6:
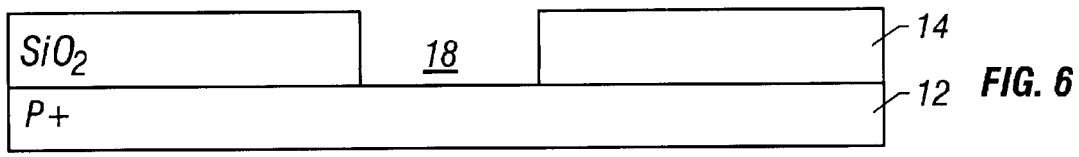
FIG. 6 is a cross-sectional view of the trench formed in FIG. 5 with the mask removed.

FIG. 3 is a side cross-sectional view of the P+ layer 12 with a layer of oxide 14 (e.g., $SiO_2$) deposited or grown thereon. In one embodiment of the present invention, both the P+ layer 12 and the oxide layer 14 have an approximate thickness of 0.5 $\mu$m. Once the oxide layer 14 has been deposited, the oxide layer 14 must be patterned separately (using two masks) for the NMOS and the PMOS transistors. FIG. 4 illustrates the addition of one mask 16 for the masking of the oxide layer 14 used to pattern the oxide layer 14 for the PMOS transistor. It will be obvious to one with ordinary skill in the art that oxide layer 14 may be patterned using well known photolithographic masking and etching techniques, resulting in the trench 18 illustrated in FIG. 5 and again in FIG. 6 after the removal of the mask 16.

Figure 7:
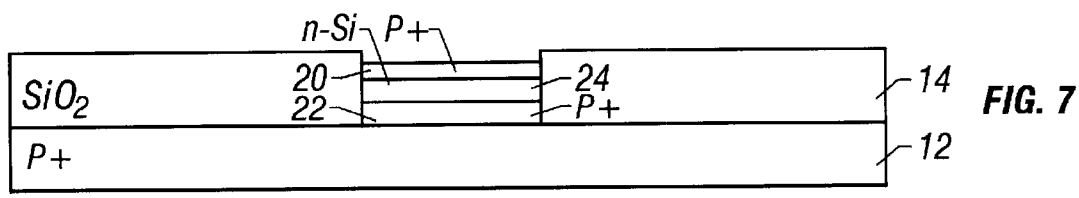
FIG. 7 is a cross-sectional view of the device of FIG. 6 with selective doped Si deposition into the trench 18.
Figure 8:
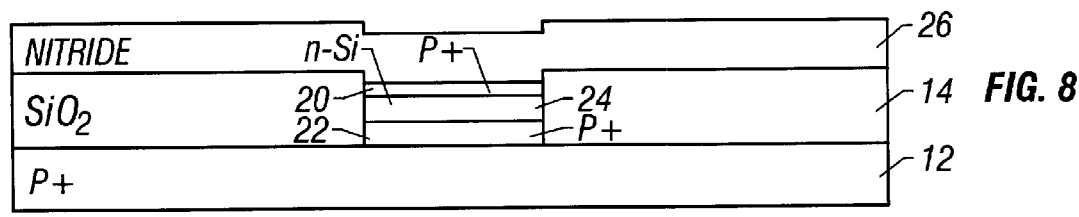
FIG. 8 is a cross-sectional view of a sacrificial layer of nitride deposited on the device illustrated in FIG. 7.
Figure 9:
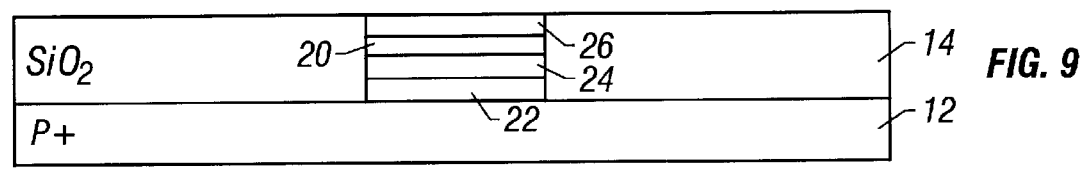
FIG. 9 is a cross-sectional view illustrating the device of FIG. 8 after a nitride polish.

FIG. 7 illustrates the device during selective Si deposition, generally formed using epitaxial growth, into the trench 18 with in-situ doping of the shown layers. Alternatively, the two tip (P+) regions 20 and 22 shown can form automatically by thermal diffusion, with the middle region 24 remaining an undoped Si layer. This alternative embodiment will be discussed in detail below. In one embodiment of the present invention, the trench 18 has an approximate thickness of greater than 0.4 $\mu$m and regions 20, 22, and 24 have a combined thickness of approximately 0.4 $\mu$m. After the Si deposition into trench 18, a sacrificial layer 26 of nitride is deposited, as illustrated in FIG. 8. In one embodiment of the present invention, the sacrificial layer 26 of nitride has an approximate thickness of 0.4 $\mu$m. FIG. 9 illustrates the device after a nitride polish, resulting in a nitride layer 26 filling the remainder of trench 18.

Figure 10:
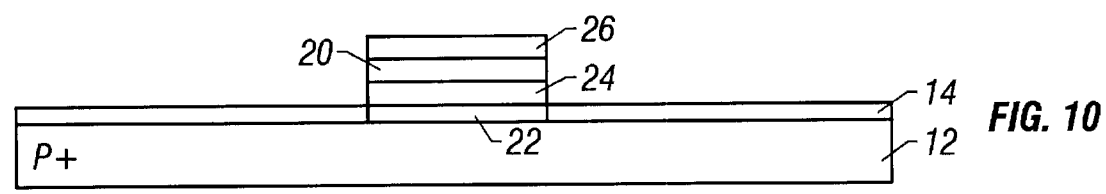
FIG. 10 is a cross-sectional view of the device of FIG. 9 after a partial oxide etch is performed.
Figure 11:
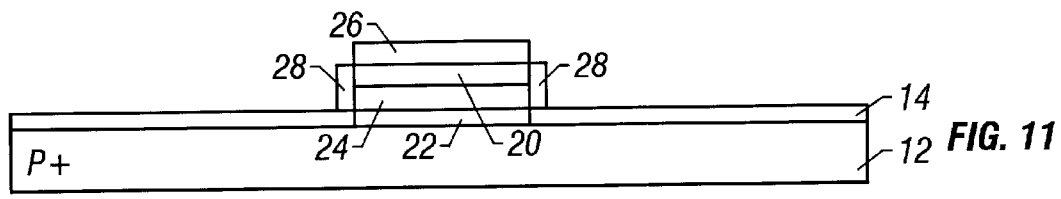
FIG. 11 is a cross-sectional view of the device of FIG. 10 after gate oxidation.

Next, a partial oxide etch is performed to remove the majority of oxide layer 14 as illustrated in FIG. 10. The oxide etch leaves a portion (e.g., approximately 0.1 $\mu$m) of the oxide layer 14 to minimize overlap capacitance. Next, gate oxidation is performed to grow oxide regions 28 as illustrated in FIG. 11. In one embodiment of the present invention, oxide regions 28 have an approximate thickness of 15 Å. Note that if (110) oriented start material (layer 12) is used, the oxidation will be along the (100) oriented plane. An alternative embodiment also uses sacrificial oxidation and etching prior to the gate oxidation to thin the channel region.

Figure 12:
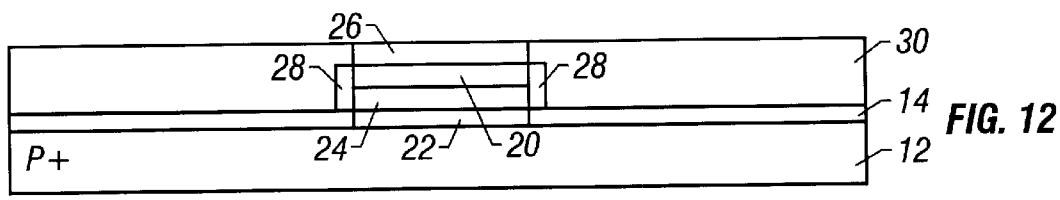
FIG. 12 is a cross-sectional view of the device of FIG. 11 after poly deposition forms a layer over the device and a poly polish levels the poly layer such that it is approximately level with the nitride layer of FIG. 12.
Figure 13:
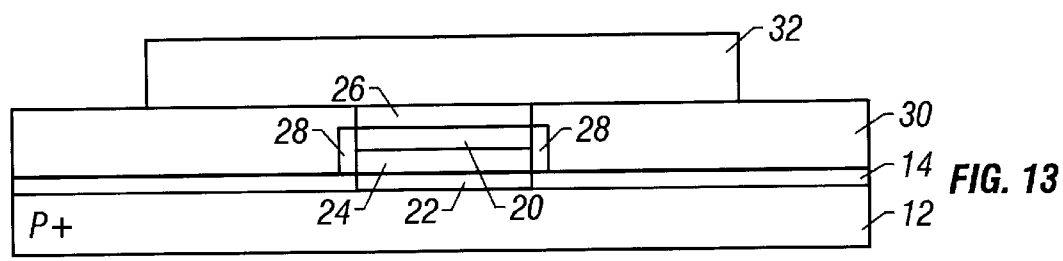
FIG. 13 is a cross-sectional view of the device 12 with a mask applied for patterning the poly layer.
Figure 14:
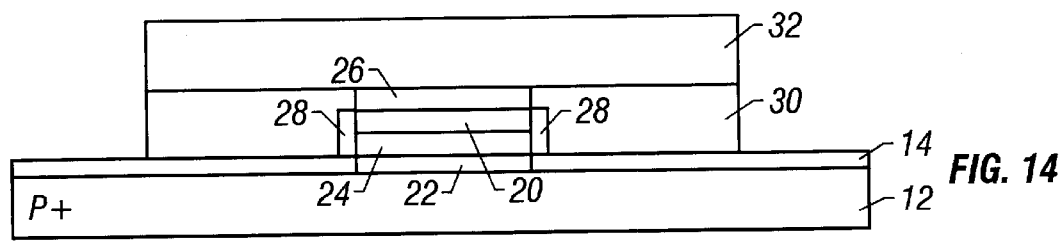
FIG. 14 is a cross-sectional view of the device showing the poly layer as it is patterned.
Figure 15:
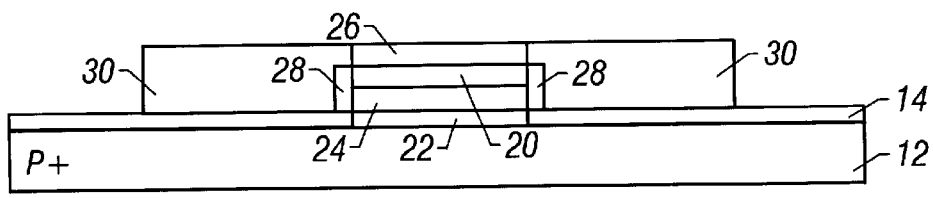
FIG. 15 is a cross-sectional view of the device of 14 after the mask is removed.
Figure 16:
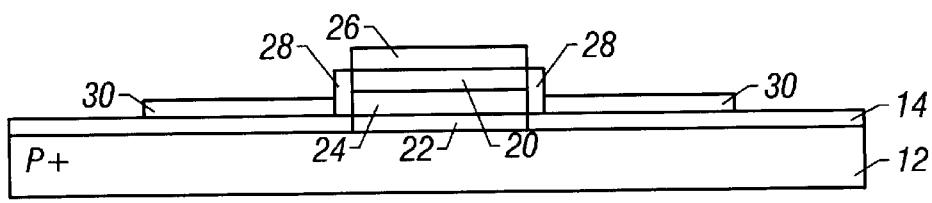
FIG. 16 is a cross-sectional view of the device of FIG. 15 after a partial poly etch is performed.

After the gate oxidation, poly deposition forms a layer over the device fabricated thus far. A poly polish is then used to level the poly layer 30 such that it is approximately level with the nitride level 26, as shown in FIG. 12. In one embodiment of the present invention, the poly layer 30 after polish is approximately 0.4 $\mu$m. Next, a mask 32 is placed above the poly layer 30 (see FIG. 13), such that the poly layer 30 may be patterned (see FIG. 14). The mask 32 is subsequently removed, leaving patterned poly layer 30 as illustrated in FIG. 15.

Figure 17:
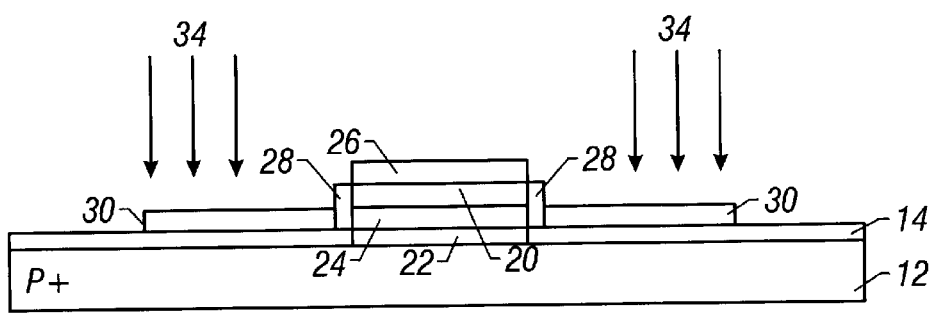
FIG. 17 is a cross-sectional view of the device of FIG. 16 as the poly layer is doped using a poly implant.
Figure 18:
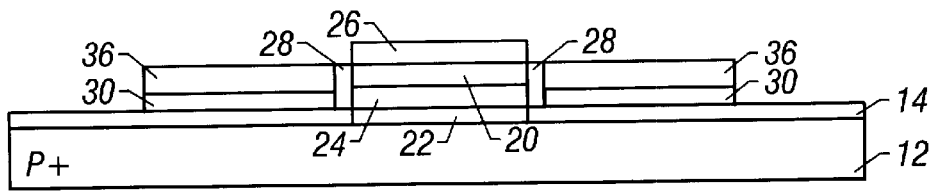
FIG. 18 is a cross-sectional view of the device of FIG. 17 after oxidation with the resulting poly oxide layer 36 illustrated.

A partial poly etch, such as a plasma etch, is then performed to minimize the poly-drain overlap. The etch produces a thinner poly layer 30 as evident in FIG. 16. In one embodiment of the present invention, the poly layer after etch is approximately 0.3 $\mu$m. Note that the poly-drain overlap can cause increased capacitance resulting in a slower transistor. Next, the poly layer 30 is doped using a poly implant 34 (note the use of a mask is not shown in the illustration) as shown in FIG. 17. This is followed by poly oxidation to further minimize the overlap capacitance. After oxidation, the poly layer has an approximate thickness of 0.2 $\mu$m. This results in a poly oxide layer 36 having an approximate thickness of 0.2 $\mu$m adjacent the poly layer 30 as shown in FIG. 18. In another embodiment, poly doping may be performed in-situ during poly deposition. In that case, the poly implant step above will not be required.

Figure 19:
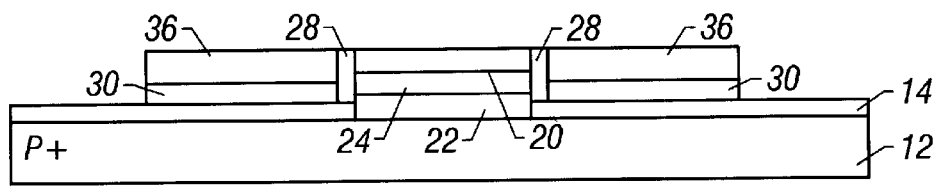
FIG. 19 is a cross-sectional view of the device of FIG. 18 with the nitride layer removed.
Figure 20A:
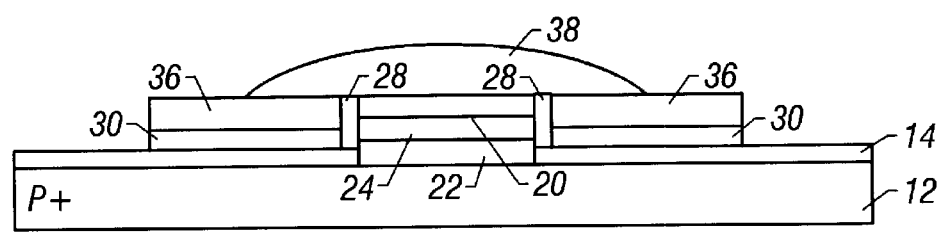
FIG. 20A is a cross-sectional view of the device of FIG. 19 illustrating the formation of the drain contact through selective Si deposition.
Figure 20B:
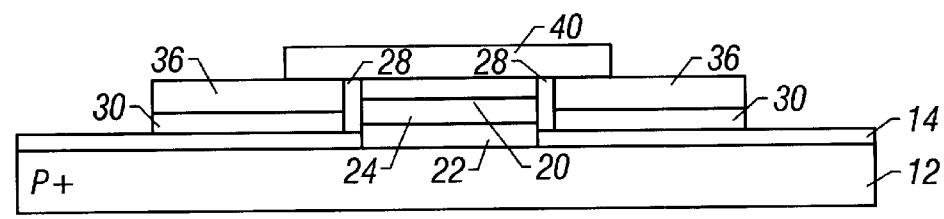
FIG. 20B is a cross-sectional view of the device of FIG. 19 illustrating the formation of the drain contact through depositing a poly-Si layer that is then masked and patterned.

After the poly oxidation, the nitride layer 26 is removed with an etching step, such as a plasma etch, as illustrated in FIG. 19. Next, selective Si deposition is applied using an epitaxial growth process to form the drain region, which is then doped to form layer 38 (as shown in FIG. 20A). In one embodiment of the present invention, layer 38 has an approximate thickness of 0.5 $\mu$m. The P+ dopant may be implanted into layer 38 or created by in-situ deposition. The resulting layer 38 tends to look like a mushroom and may need further optimization since it often gets too thick. FIG. 20B illustrates a second, alternative step to that described above. Instead of using a selective Si deposition for the drain region, in this alternative step, a poly-Si layer 40 is deposited and then masked for patterning (not shown). Then, as with the above step, the P+ dopant may be implanted using a mask process (also not shown). In one embodiment, the poly-Si layer 40 has an approximate thickness of 0.5 $\mu$m.

Figure 21:
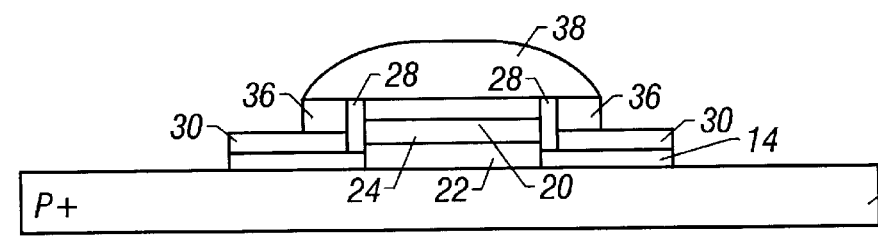
FIG. 21 is a cross-sectional view of the device of FIG. 20A after an oxide etch is performed to remove the exposed sections of oxide layers.
Figure 22:
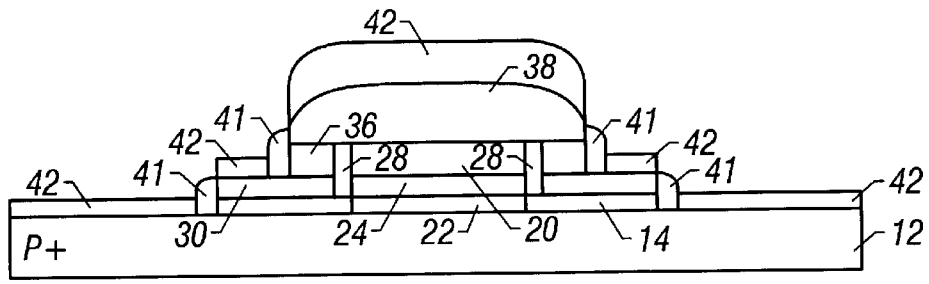
FIG. 22 is a cross-sectional view of the device of FIG. 21 illustrating the nitride spacers 41 created and a subsequent salicidation process.
Figure 23:
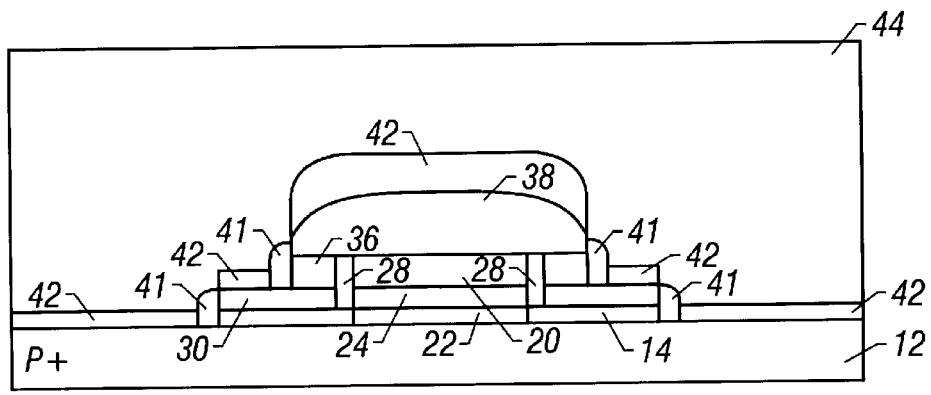
FIG. 23 is a cross-sectional view of the device of FIG. 22 illustrating an ILD deposition and polish.
Figure 24:
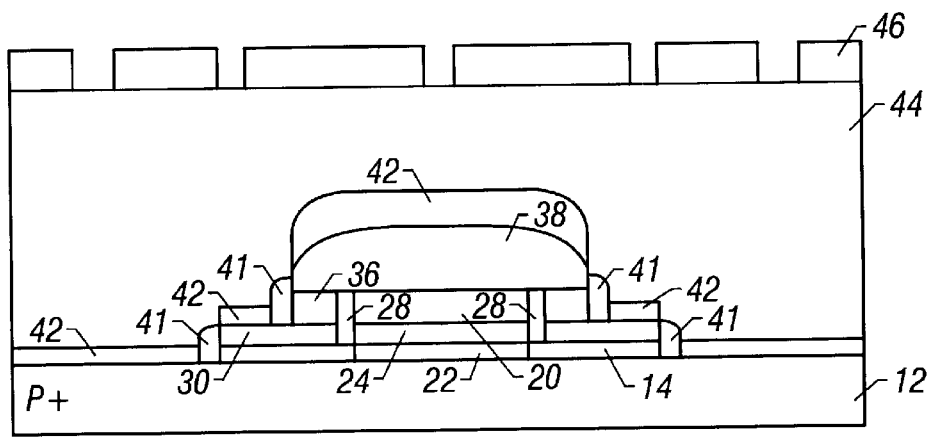
FIG. 24 is a cross-sectional view of the device of FIG. 23 with a mask applied.
Figure 38:
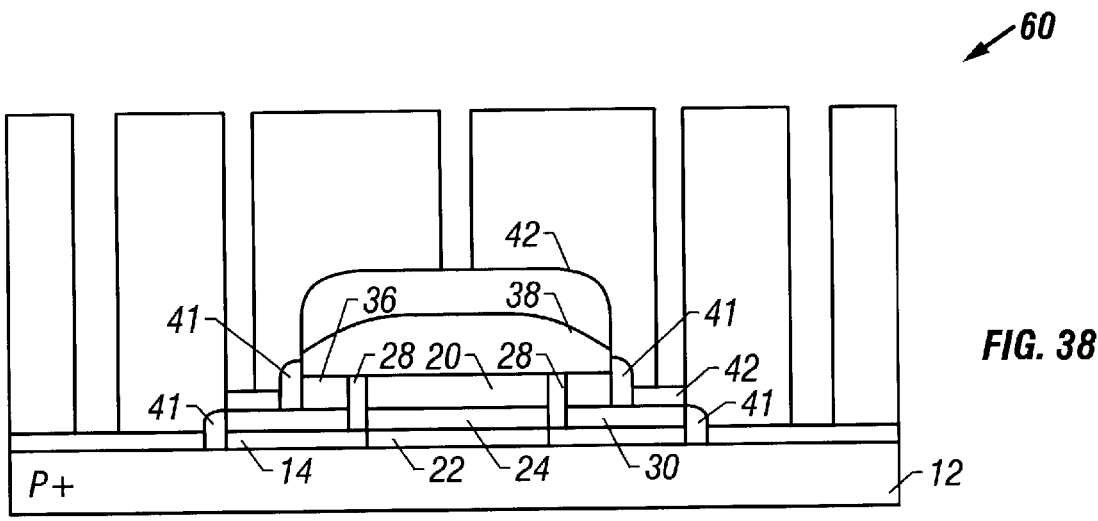
FIG. 38 is a cross-sectional view of the device of the present invention.

After the drain region (whether 38 or 40) has been deposited, an oxide etch is then performed to remove the exposed sections of layer 14 of SiO$_2$ and layer 36 of poly oxide as is illustrated in FIG. 21. Next, nitride spacers 41 are created using the same techniques as performed in conventional MOS fabrication. Subsequently, the salicidation process forms salicide layer 42 as shown in FIG. 22. In one embodiment, salicide layer 42 has an approximate thickness of 300 Å. The formation of the spacer 41 is followed by an ILD deposition 44 having an approximate thickness of 1.5 $\mu$m and polish as illustrated in FIG. 23. A mask 46 is then applied (see FIG. 24) followed by a contact etching step, resulting in the device 60 illustrated in FIG. 38 and labeled more extensively in FIG. 39.

Figure 25:
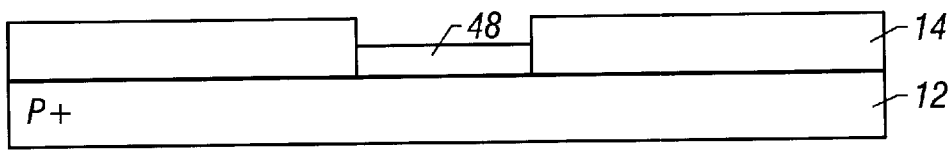
FIG. 25 is a cross-sectional view of the device of FIG. 6 with a selective Si deposition formed in the trench.
Figure 26:
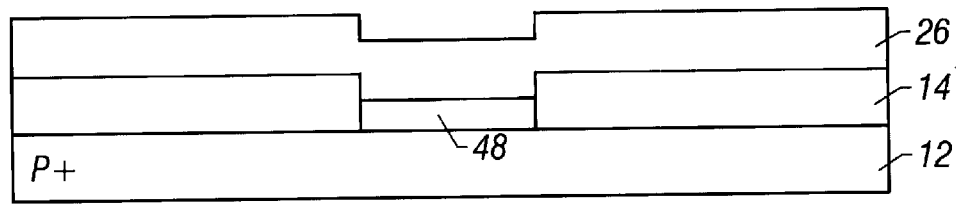
FIG. 26 is a cross-sectional view of the device of FIG. 25 after deposition of a sacrificial layer of nitride.
Figure 27:
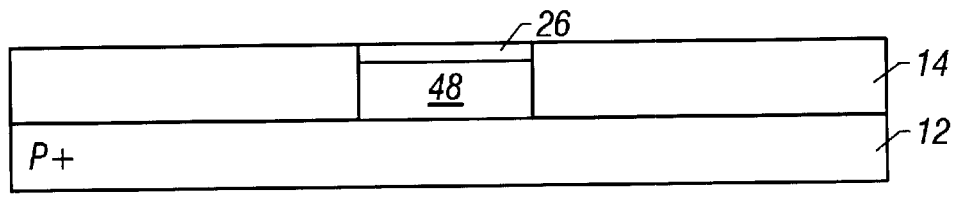
FIG. 27 is a cross-sectional view of the device of FIG. 26 after the nitride layer has been polished.

An alternative method of forming the device 60 is illustrated in FIGS. 25–37. The method illustrated in FIGS. 25–37 is simpler and provides more control over the dimensions of the tips and channels in the final device 60. The initial steps are the same as the above described embodiment and illustrated in FIGS. 1–6. After trench 18 is formed in the SiO$_2$ layer 14, a selective Si deposition is formed in trench 18 to form layer 48, as shown in FIG. 25. Unlike above, however, doping to form the tip regions is not done at this step. Next, a sacrificial layer 26 of nitride is deposited (see FIG. 26) and then polished (see FIG. 27).

Figure 28:
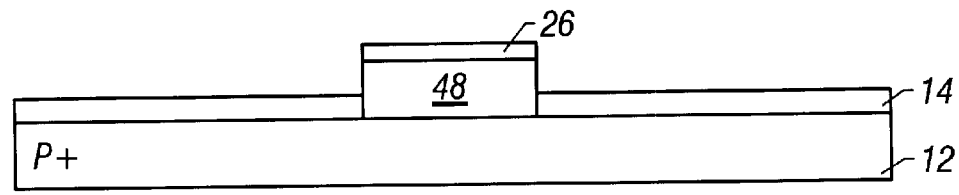
FIG. 28 is a cross-sectional view of the device of FIG. 27 after a partial oxide etch is performed.
Figure 29:
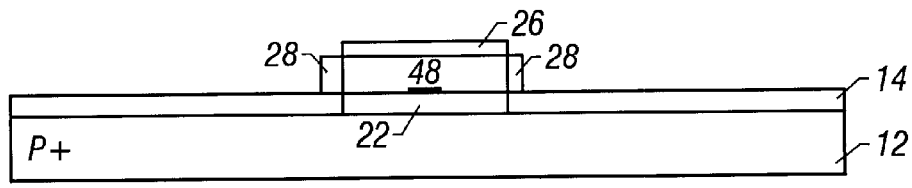
FIG. 29 is a cross-sectional view of the device of FIG. 28 after gate oxidation.
Figure 30:
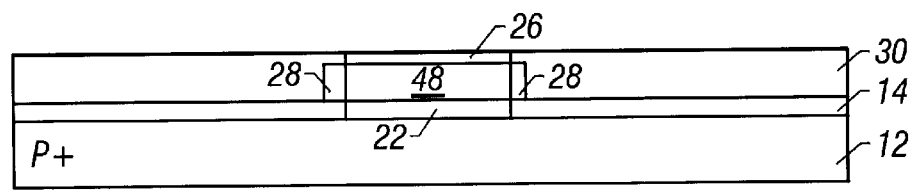
FIG. 30 is a cross-sectional view of the device of FIG. 29 after a poly deposition and polish.
Figure 31:
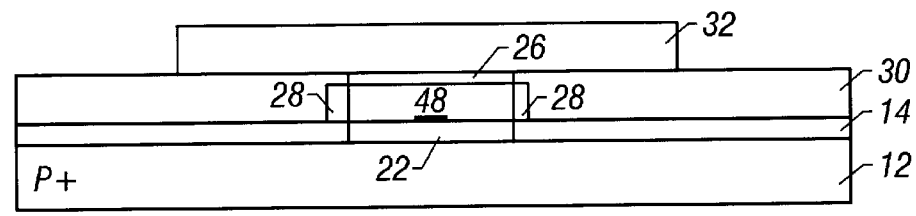
FIG. 31 is a cross-sectional view of the device of FIG. 30 with a mask applied.
Figure 32:
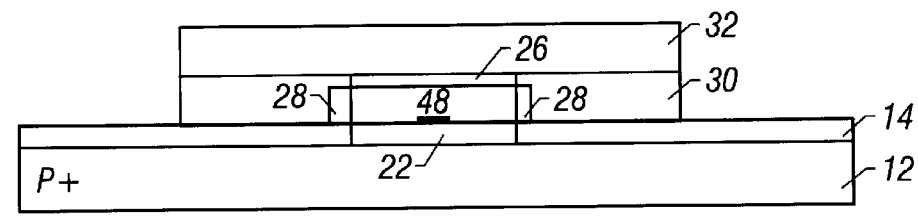
FIG. 32 is a cross-sectional view of the device of FIG. 31 showing the poly layer as it is patterned.
Figure 33:
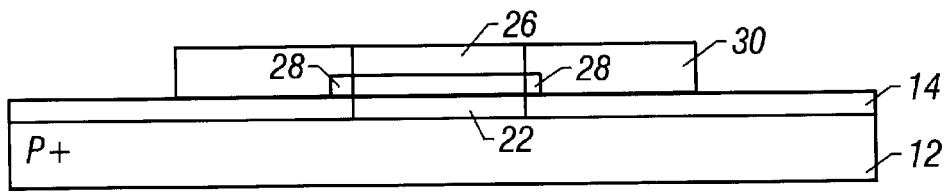
FIG. 33 is a cross-sectional view of the device of FIG. 32 after the mask has been removed.
Figure 34:
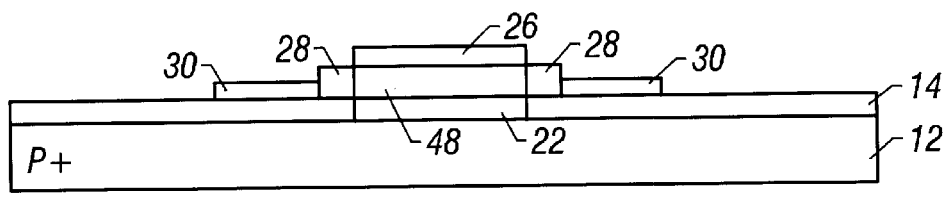
FIG. 34 is a cross-sectional view of the device of FIG. 33 after a partial poly etch.
Figure 35:
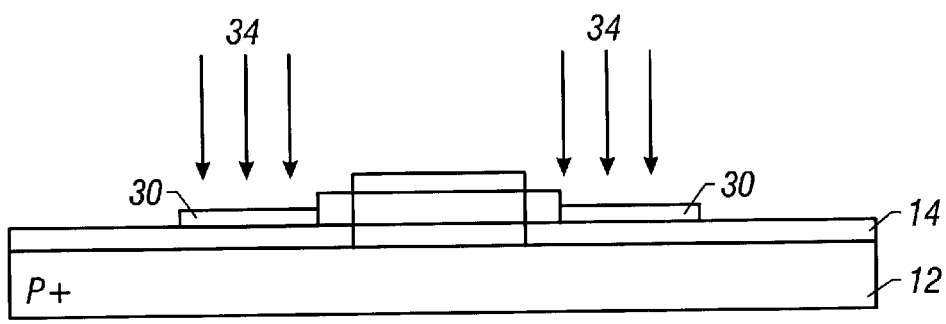
FIG. 35 is a cross-sectional view of the device of FIG. 34 showing a poly implant.
Figure 36:
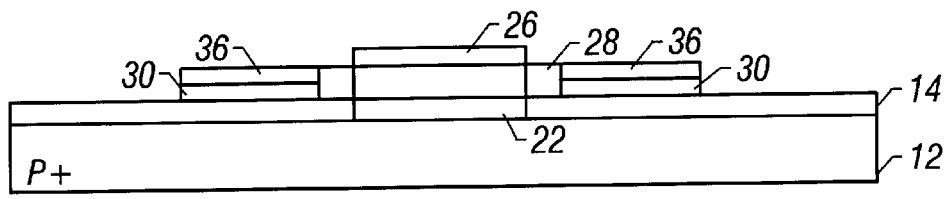
FIG. 36 is a cross-sectional view of the device of FIG. 35 after the formation of a poly oxide layer.

After the nitride deposition and polishing, a partial oxide etch is performed on layer 14, leaving, for example, approximately 0.1 $\mu$m of SiO$_2$ to minimize overlap capacitance (see FIG. 28). Next, gate oxidation is performed to produce regions 28 (see FIG. 29). The gate oxidation is followed by a poly deposition and poly polish to form layer 30 as illustrated in FIG. 30. A mask 32 is then applied (see FIG. 31), followed by a partial poly etch to minimize the poly-drain overlap (see FIG. 32) resulting in the device shown in FIG. 33. After the partial poly etch, a poly implant 34 using a mask (not shown) illustrated in FIG. 35 is performed. A subsequent oxidation step results in the formation of a poly oxide layer 36 that is used to minimize overlap capacitance (see FIG. 36).

Figure 37:
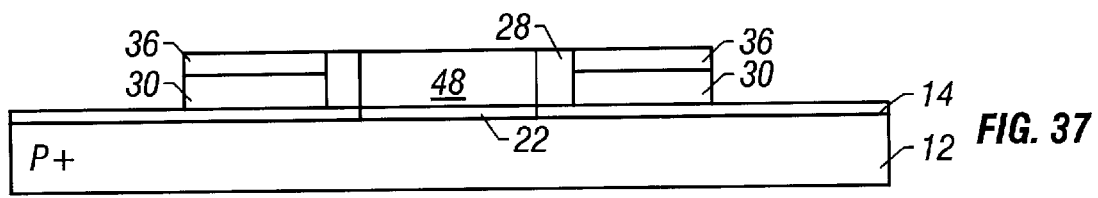
FIG. 37 is a cross-sectional view of the device of FIG. 36 after the nitride layer is removed.

Next, nitride layer 26 is removed as shown in FIG. 37. Once the nitride layer 26 is removed, a P+ selective Si deposition for formation of the drain contact 38 is performed (see FIG. 20A). The two tip (P+) regions 20 and 22 are formed automatically by thermal diffusion from the source and drain regions. The remaining steps of this second embodiment are the same as those illustrated above in FIGS. 21–24 and 38.

Figure 39:
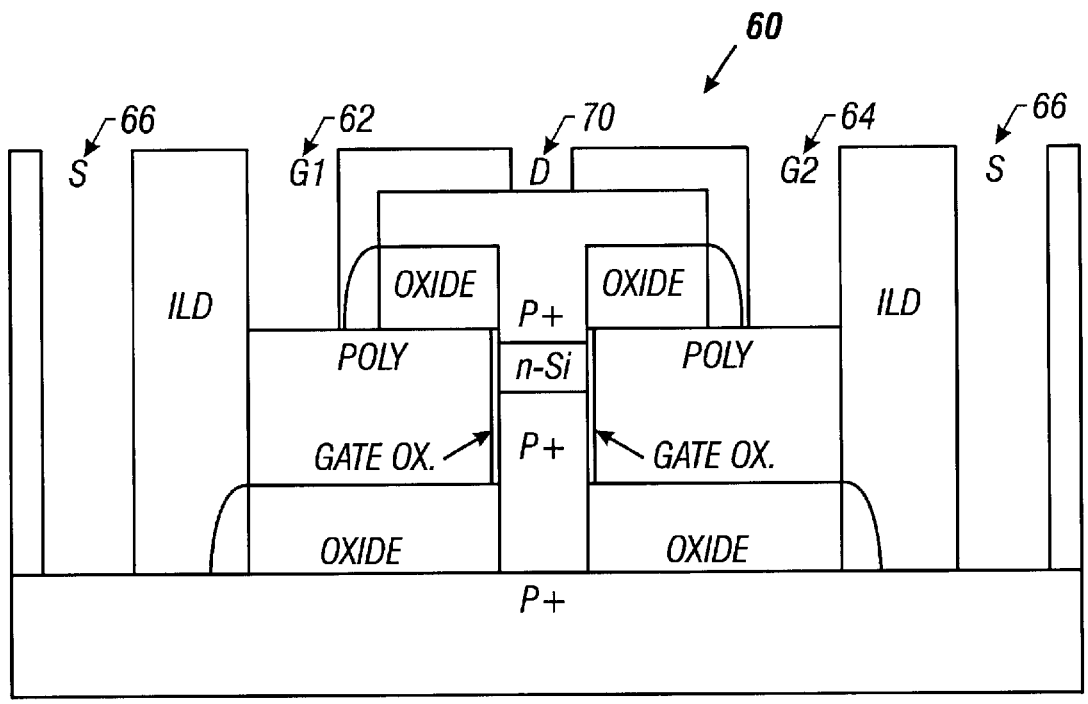
FIG. 39 is a cross-sectional view of the device of the present invention with each of the different gates, sources and drain labeled.
Figure 40:
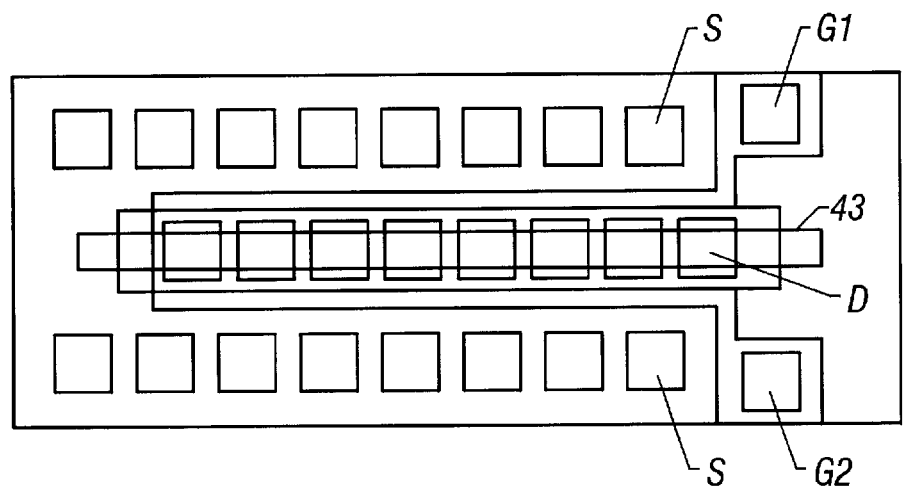
FIG. 40 is a top view of the device illustrated in FIG. 38.

FIG. 39 is a clearly labeled example of the device 60 formed by following the above manufacturing steps. The device 60 includes a first gate 62 and a second gate 64. Source contacts 66 are made where ILD is directly on top of the substrate as shown. The two gates 62 and 64 share a common drain 70. FIG. 40 shows an example of a top view of the device 60. Use of an endcap 43 for the channel region beyond the poly boundary is necessary to separate the two gates as shown in FIG. 40.

Figure 41:
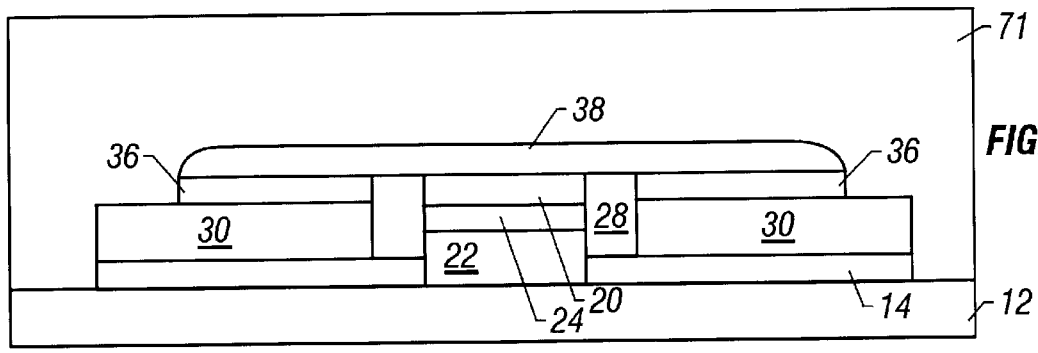
FIG. 41 is a cross-sectional view of the device of FIG. 18 with a layer of oxide deposited thereon.
Figure 42:
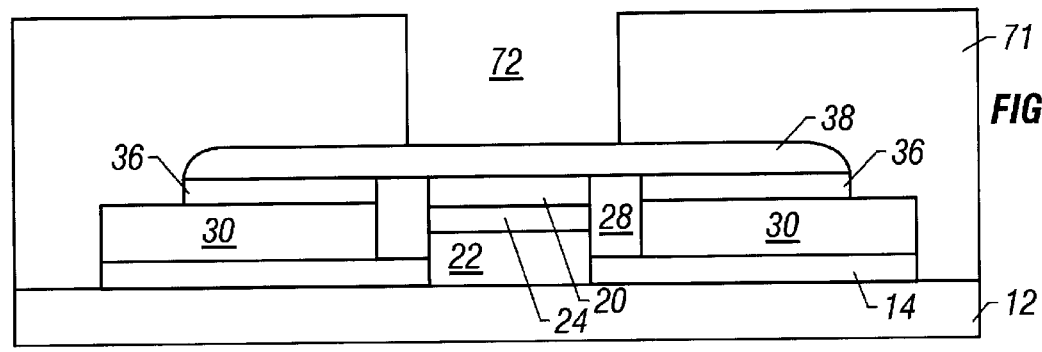
FIG. 42 is a cross-sectional view of the device of 41 after the oxide layer has been patterned.
Figure 43:
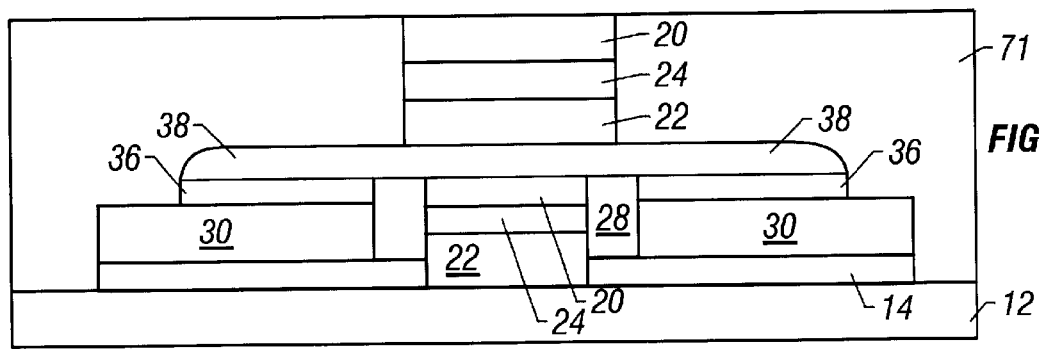
FIG. 43 is a cross-sectional view of selective deposition of Si for a second layer device.

Note that a third embodiment may be followed to extend the above concept. Beginning with the device illustrated in FIG. 21, a layer 71 of oxide is deposited as illustrated in FIG. 41. A mask is then applied (not shown) and the oxide is patterned to form a trench 72, as illustrated in FIG. 42. Selective deposition of Si is then deposited in trench 72 for the next layer device. From this point forward, the steps of the described embodiments can be followed to fabricate a stacked series of gates, as shown in FIG. 43. In one embodiment having a stacked series of gates, the first and second gate electrodes share a common source and drain as do the third and fourth gate electrodes. In a further embodiment, the common drain of the first and second gate electrodes also acts as the common source of the third and fourth gate electrodes.

We claim:

1. An apparatus comprising:

an underlying doped region;

a first gate electrode formed above said underlying doped region;

a second gate electrode formed above said underlying doped region and substantially planar with said first gate electrode;

a channel disposed between said first and second gate electrodes and extending down to said underlying doped region, said channel being formed by selective silicon deposition, wherein first doped tip region and a second doped tip region are separated by an undoped region, said first doped tip region adjacent to said underlying doped region;

a common doped region formed above said first and second gate electrodes and above said channel and overlying the second doped tip region; and at least one common contact extending down to said underlying doped region.

2. The apparatus of claim 1 wherein said common doped region forms a common drain and said at least one common contract is to a common source.

3. The apparatus of claim 2 further comprising a dielectric layer formed above said common drain, source and two electrodes, said two electrodes being polished to have a substantially planar surface; and a second channel structure formed in said dielectric layer overlying said common drain to form another transistor structure overlying the common drain.

4. The apparatus of claim 3 wherein said common drain of said first and second gate electrodes functions as a common contact to said transistor structure overlying said common drain.

5. The apparatus of claim 1 wherein said underlying doped region, common doped region and two electrodes form a dual gate floating body transistor.

6. The apparatus of claim 1 further comprising a dielectric layer formed above said common doped region and said two electrodes, said two electrodes being polished to have a substantially planar surface.

7. The apparatus of claim 1 wherein said underlying doped region is a doped region in a substrate.

* * * * *